US006739880B2

(12) United States Patent
Toyota

(10) Patent No.: US 6,739,880 B2
(45) Date of Patent: May 25, 2004

(54) CIRCUIT BOARD-TO-BOARD INTERCONNECTION DEVICE

(75) Inventor: Kazuma Toyota, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/266,721

(22) Filed: Oct. 8, 2002

(65) Prior Publication Data

US 2003/0082935 A1 May 1, 2003

(30) Foreign Application Priority Data

Oct. 16, 2001 (JP) ....................................... 2001-318086

(51) Int. Cl.[7] ........................... H01R 12/00; H05K 1/00

(52) U.S. Cl. ........................... 439/74; 439/92; 439/573; 174/138 G

(58) Field of Search ............................. 439/74, 64, 92, 439/573; 174/138 G

(56) References Cited

U.S. PATENT DOCUMENTS 4,950,173 A * 8/1990 Minemura et al. ............ 439/82
6,065,977 A * 5/2000 Toda et al. ................... 439/66
6,089,882 A * 7/2000 Costello ...................... 439/95
6,135,792 A * 10/2000 Kuo ............................ 439/92
6,319,017 B1 * 11/2001 Kuo ............................ 439/64

* cited by examiner

*Primary Examiner*—Tulsidas Patel
*Assistant Examiner*—Hae Moon Hyeon
(74) *Attorney, Agent, or Firm*—Stephen Z. Weiss

(57) ABSTRACT

A connection device is provided for connecting a pair of circuit boards. A dielectric housing has a spacer portion for positioning between an upper circuit board and a lower circuit board. A conductive metal connecting member includes an upper plate portion sandwiched between the upper circuit board and an upper surface of the spacer portion. A lower plate portion is sandwiched between the lower circuit board and a lower surface of the spacer portion. A connecting portion connects the upper and lower plate portions. A fastener extends through the circuit boards and the spacer portion. The upper plate portion is engageable with a conductive pad on the upper circuit board and includes a hole through which the fastener extends. The lower plate portion is engageable with a conductive pad on the lower circuit board and is disposed to one side away from the fastener.

15 Claims, 5 Drawing Sheets

CIRCUIT BOARD-TO-BOARD INTERCONNECTION DEVICE

FIELD OF THE INVENTION

This invention generally relates to the art of electrical connectors and, particularly, to a connecting device for establishing electrical communication between a pair of circuit boards.

BACKGROUND OF THE INVENTION

Connection devices have been provided for connecting a pair of circuit boards to establish electrical communication between an upper circuit board and a grounding pad of a lower circuit board, for instance. An example of such a device is shown in U.S. Pat. No. 6,065,977, dated May 23, 2000, which is based on Japanese Application 9-227250.

The connection device shown in the above patent includes an insulating housing having an integral spacer portion disposed between the upper circuit board and the lower circuit board. An electrically conductive metal member has an upper plate sandwiched between the upper circuit board and an upper surface of the spacer portion, and a lower plate sandwiched between the lower circuit board and a lower surface of the spacer portion. Electrical connection is established between the upper and lower plates and grounding pads on the upper and lower circuit boards, respectively. Fastening means in the form of a bolt extends through the upper and lower circuit boards and the spacer portion, as well as through both the upper and lower plates of the electrically conductive metal member. Therefore, the spacer portion is clamped between the upper and lower plates of the conductive metal member. This connection device is mounted on the lower circuit board and, therefore, a recessed area of the spacer portion accommodates the lower plate so that the lower plate is generally flush with the bottom of the spacer portion.

Problems are encountered with connection devices as described above. First of all, since the fastening bolt extends through holes in both the upper plate and the lower plate of the conductive metal member, relatively expensive precision machining must be performed so that the through holes in the upper and lower plates are in strict alignment for receiving the bolt so that insertion of the bolt does not misalign the plates. Another problem concerns the dimensional relationship between the spacer portion and the conductive metal member. Specifically, if the spacer portion is bowed relative to the insulating housing due to external factors, such as heat or the like, the plates of the conductive metal member may move with the spacer portion and destroy flush surface relationship of the plates with the circuit boards which would make it impossible to establish good electrical communication between the plates and the grounding pads of the board. At least, abnormal stresses are created in the solder connections.

The present invention is directed to providing a new and improved electrically conductive metal member in the form of a connection device as described above, and avoiding the various problems associated therewith.

SUMMARY OF THE INVENTION

An object, therefore, of the invention is to provide a new and improved connection device for connecting a pair of circuit boards.

In the exemplary embodiment of the invention, the connection device includes a dielectric housing having a spacer portion for positioning between an upper circuit board and a lower circuit board. A conductive metal connecting member includes an upper plate portion sandwiched between the upper circuit board and an upper surface of the spacer portion, a lower plate portion sandwiched between the lower circuit board and a lower surface of the spacer portion, and a connecting portion connecting the upper and lower plate portions. A fastener extends through the circuit boards and the spacer portion. The upper plate portion is engageable with a conductive pad on the upper circuit board and includes a hole through which the fastener extends. The lower plate portion is engageable with a conductive pad on the lower circuit board and is disposed to one side away from the fastener. Therefore, the fastener does not extend through both the upper plate portion and the lower plate portion and avoids many of the problems of the prior art.

As disclosed herein, the fastener comprises a bolt. The conductive metal connecting member is generally C-shaped. The housing, including the spacer portion, has a bottom face for mounting on the lower circuit board, and the spacer portion includes a recessed area for receiving the lower plate portion with a lower surface thereof being generally flush with the bottom face of the spacer portion.

Another feature of the invention includes complementary interengaging latch means between the connecting member and the housing at the spacer portion. The latch means herein is provided by a latch hole in one of the upper and lower plate portions for receiving a latch boss on the spacer portion of the housing. In the illustrated embodiment herein, both the upper and lower plate portions have latch holes for receiving latch bosses on the top and bottom of the spacer portion.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
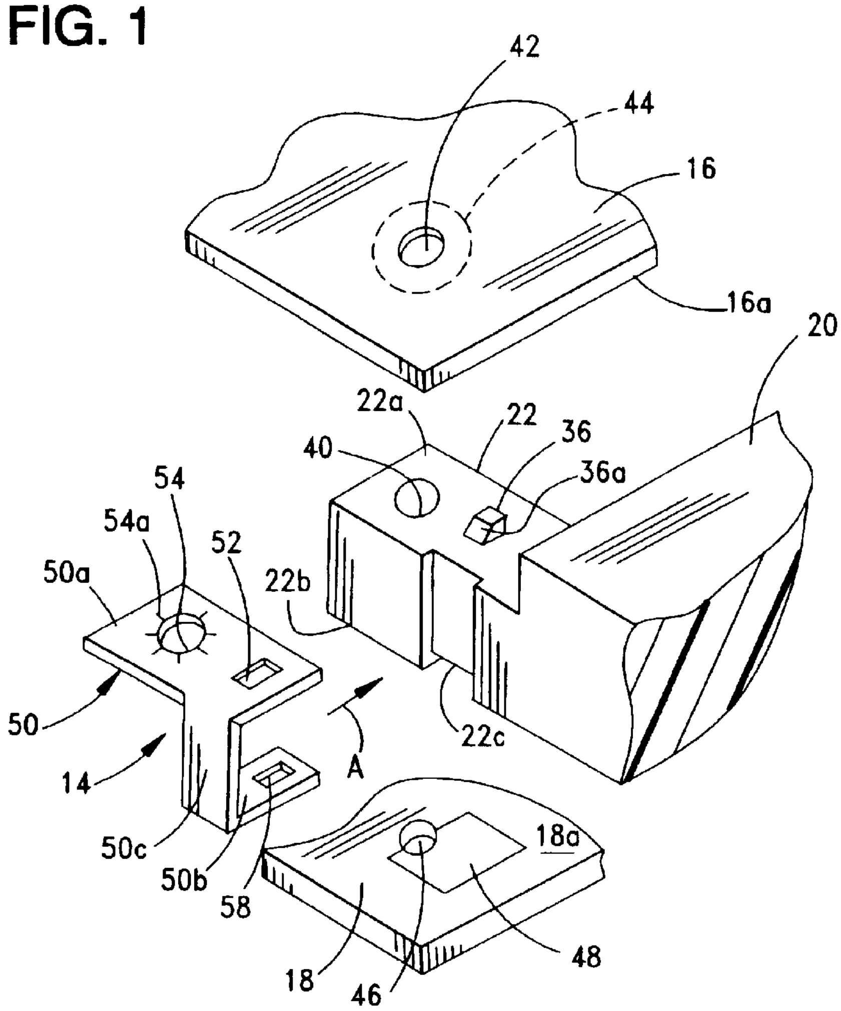
FIG. 1 is an exploded perspective view of the connection device of the invention at one end of a connector housing shown fragmented and in section.
Figure 2:
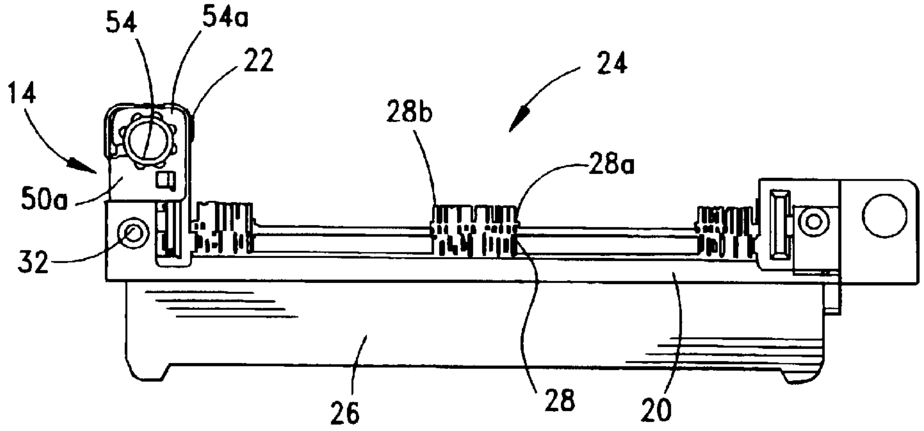
FIG. 2 is a top plan view of a connector incorporating the connection device at one end thereof.
Figure 3:
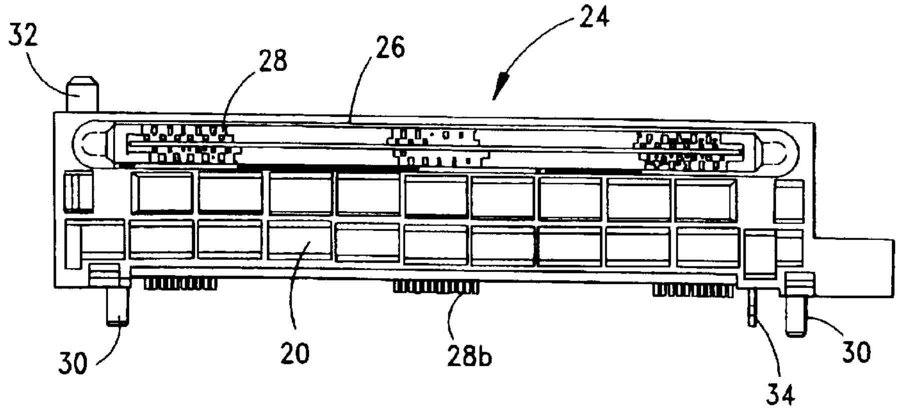
FIG. 3 is a front elevational view of the connector of FIG. 2.
Figure 4:
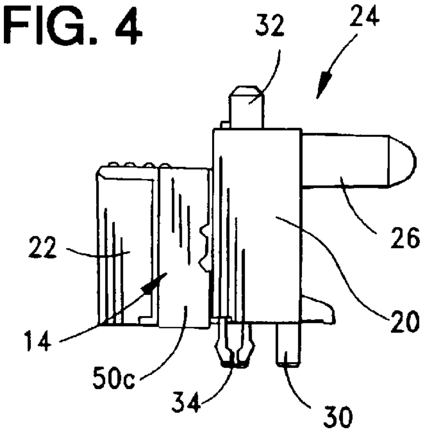
FIG. 4 is a left-hand side elevational view of the connector.
Figure 5:
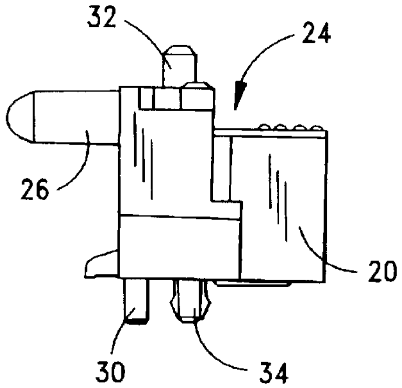
FIG. 5 is a right-hand side elevational view of the connector.

Referring to the drawings in greater detail, and first to FIG. 1, the invention is embodied in a connection device, generally designated 14, for connecting a pair of circuit boards, namely an upper circuit board 16 and a lower circuit board 18. The connection device is located at one end of a connector housing 20 having a spacer portion 22 located between the circuit boards.

Referring to FIGS. 2–5 in conjunction with FIG. 1, connection device 14 is located at one end of an electrical connector, generally designated 24, which includes housing 20. The connector has a receptacle portion 26 for mating with a complementary mating connector. Housing 20 mounts a plurality of terminals 28 having tail portions 28*a* projecting out of the rear of housing 20 and terminating in solder tails 28*b* for solder connection to appropriate circuit traces on lower printed circuit board 18. The housing has board mounting posts 30 on the bottom thereof for insertion into appropriate mounting holes in lower circuit board 18, and at least one mounting post 32 projecting from the top thereof for insertion into an appropriate mounting hole in upper circuit board 16. A metal hold-down member 34 also projects from the bottom of the housing for insertion into an appropriate hole in lower circuit board 18.

Figure 6:
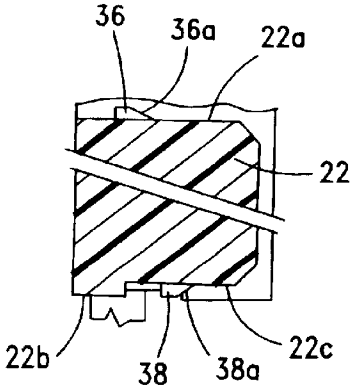
FIG. 6 is an enlarged, fragmented section through the spacer portion showing the latch bosses for the connection device of the invention.
Figure 7:
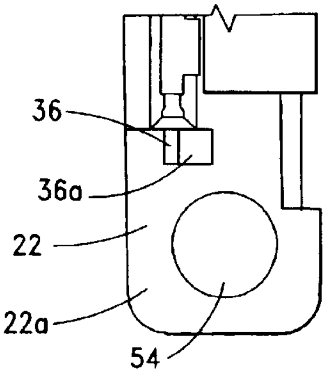
FIG. 7 is an enlarged top plan view of the spacer portion.
Figure 8:
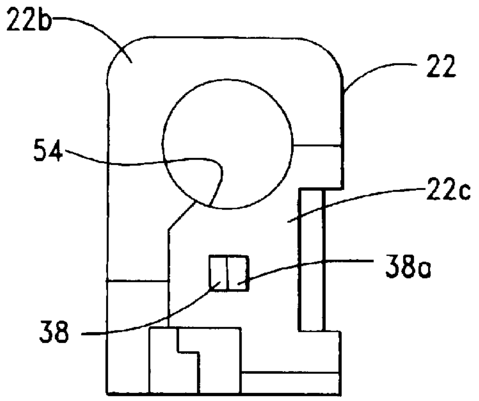
FIG. 8 is an enlarged bottom plan view of the spacer portion.

Referring to FIGS. 6–8 in conjunction with FIG. 1, spacer portion 22 of housing 20 includes an upper surface 22*a* and a lower surface 22*b*. A recessed area 22*c* is formed in lower surface 22*b*. A latch boss 36, having an angled surface 36*a* projects upwardly from spacer portion 22, and a latch boss 38, having an angled surface 38*a*, projects downwardly from spacer portion 22. A through hole 40 projects vertically through the entire spacer portion.

Referring back to FIG. 1, upper circuit board 16 has a through hole 42 surrounded by a grounding pad 44 on a bottom side 16*a* of the circuit board. Lower circuit board 18 has a through hole 46 with a grounding pad 48 adjacent thereto on a top side 18*a* of the circuit board.

As best seen in FIG. 1, connection device 14 includes a conductive metal connecting member, generally designated 50. The metal connecting member is generally C-shaped as defined by an upper plate portion 50*a*, a lower plate portion 50*b* and a connecting plate portion 50*c* joining the upper and lower plate portions. Upper plate portion 50*a* has a rectangular latch hole 52 and a circular fastener hole 54. The peripheral edge of fastener hole 54 is slit, as at 54*a*, and the pie-shaped sections formed by the slits are bent to define projections 56 (FIGS. 11 and 12) for establishing a positive engagement with grounding pad 44 on the bottom side 16*a* of upper circuit board 16. Lower plate portion 50*b* of conductive metal connecting member 50 includes a rectangular latch hole 58.

Connection device 14 is assembled as follows. Conductive metal connecting member 50 is assembled to spacer portion 22 in the direction of arrow "A" (FIG. 1). During assembly, upper plate portion 50*a* and lower plate portion 50*b* will engage angled surfaces 36*a* and 38*a* (FIG. 6) of latch bosses 36 and 38, respectively, whereby the angled surfaces spread the plate portion apart until latch bosses and 36 and 38 become aligned with latch holes 52 and 58, respectively. The plate portions then will snap back toward each other, whereupon latch bosses 36 and 38 will securely latch within latch holes 52 and 58, respectively, of upper and lower plate portions 50*a* and 50*b*, respectively. When connecting member 50 is assembled to spacer portion 22, fastener hole 54 in upper plate portion 50*a* will be aligned with through hole 40 in the spacer portion.

Figure 11:
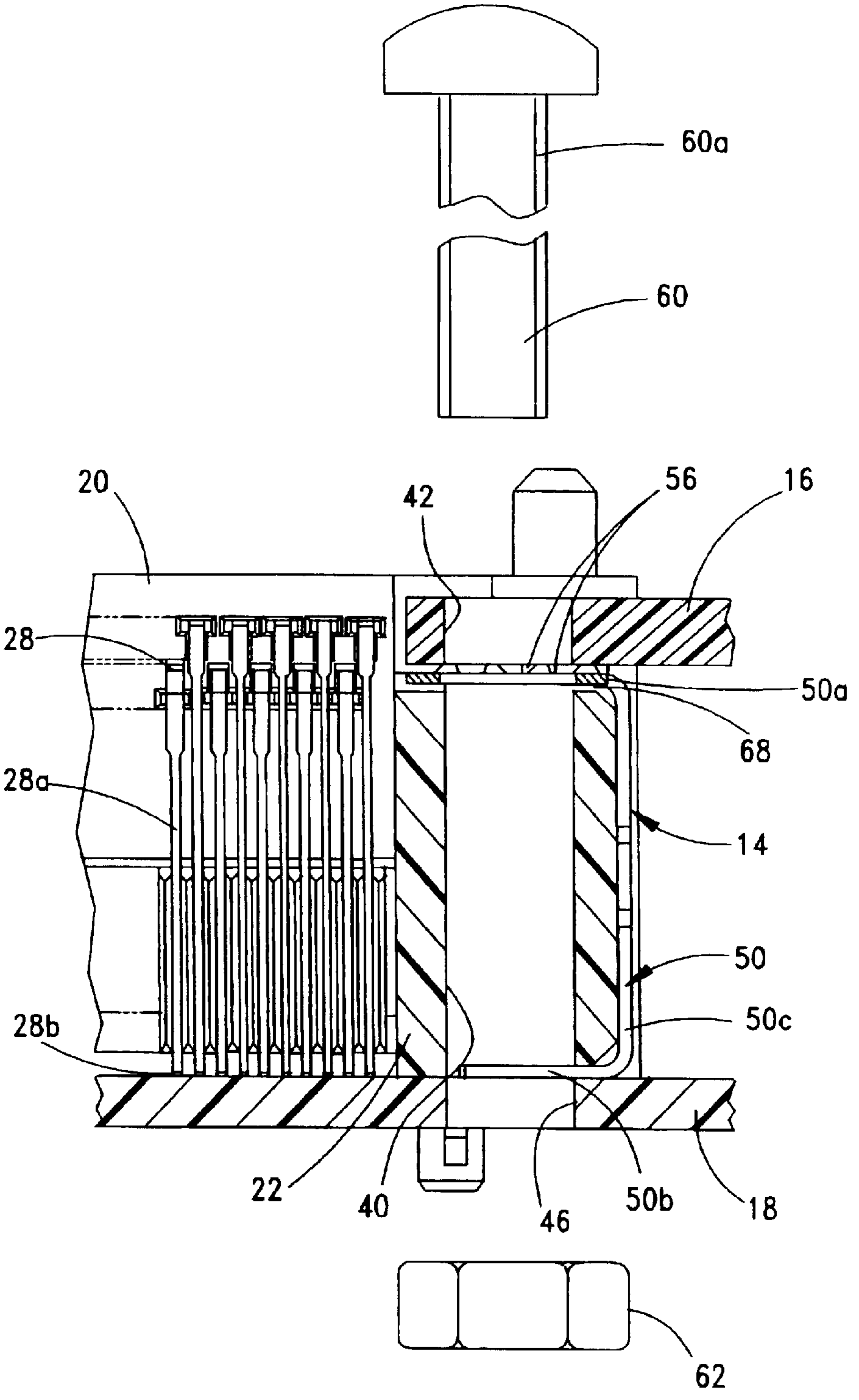
FIG. 11 is an enlarged vertical section through the connection device at one end of the connector, in conjunction with a pair of printed circuit boards.
Figure 12:
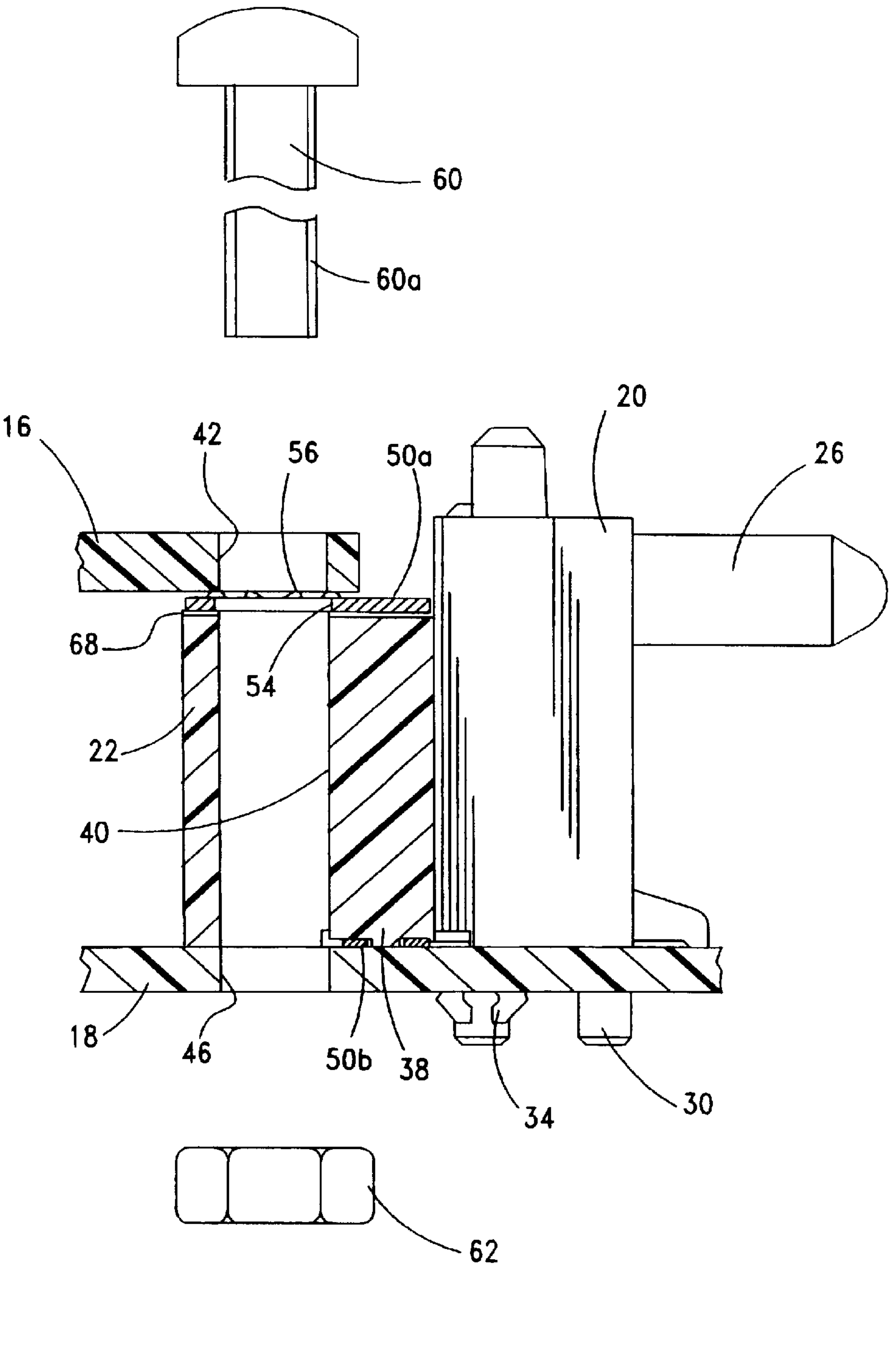
FIG. 12 is a view similar to that of FIG. 11, but taken generally at a right-angle thereto.

Upper circuit board 16 and lower circuit board 17 then are assembled as shown in FIGS. 11 and 12 so that hole 42 in the upper circuit board and hole 46 in the lower circuit board are aligned with through hole 40 which extends vertically through spacer portion 22. An elongated fastener 60 (FIGS. 11 and 12) then is inserted downwardly through hole 42 in upper circuit board 16, through hole 54 in upper plate portion 50*a*, through hole 40 in spacer portion 22 and through hole 46 in lower circuit board 18. Although various types of fasteners may be employed, such as rivets or the like, fastener 60 in the preferred embodiment is an externally threaded bolt having external threads 60*a* for threading into a nut 62 in order to clamp the entire assembly of upper and lower circuit boards 16 and 18, respectively, onto the top and bottom of connection device 14 which includes the upper and lower plate portions of metal connecting member 50 and spacer portion 22 of housing 20. It can be seen that fastener 60 does not pass through lower plate portion 50*b* of conductive metal connecting member 60 and, thereby, avoids the problems of the prior art discussed in detail in the "Background", above. Electrical communication is established between grounding pad 44 on the bottom side of upper circuit board 16, through metal connecting member 50, to grounding pad 48 on the top side of lower circuit board 18. Upper plate portion 50*a* engages grounding pad 44, and lower plate portion 50*b* engages grounding pad 48.

Figure 9:
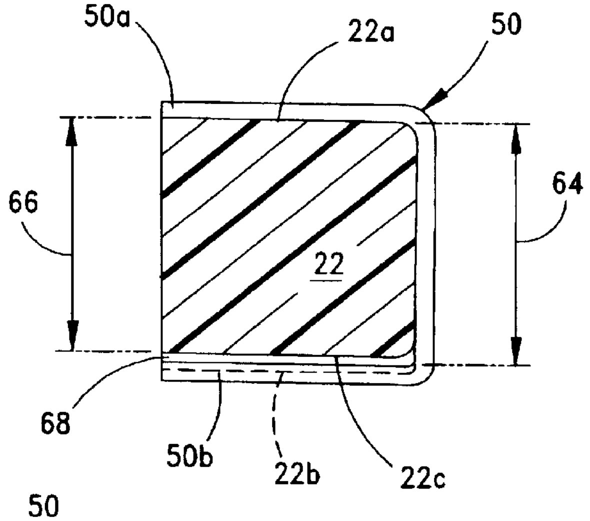
FIG. 9 is a somewhat schematic illustration showing a section through the spacer portion in conjunction with the C-shaped metal connecting member for explaining the dimensional relationships therebetween.
Figure 10:
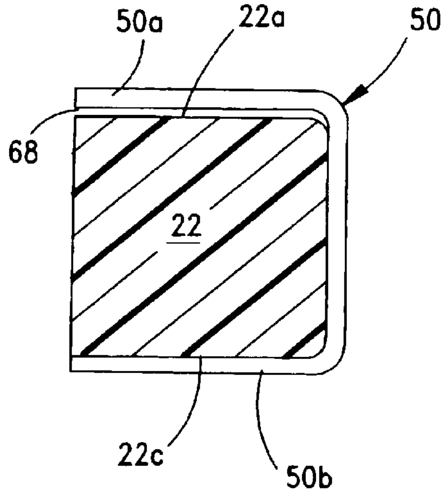
FIG. 10 is a view similar to that of FIG. 9, for further explanatory purposes.

Finally, FIGS. 9 and 10 show a feature of the invention whereby any bowing of spacer portion 22 does not affect conductive metal connecting member 50. Specifically, dimension 64 in FIG. 9 represents the distance between the inside surfaces of upper plate portion 50*a* and lower plate portion 50*b*. Dimension 66 represents the distance between upper surface 22*a* of spacer portion 22 and the surface inside recessed area 22*c* in lower surface 22*b* of the spacer portion. Dimension 64 between the plate portions is slightly greater than the dimension 66 which represents the thickness of the spacer portion embraced by the plate portions. This difference in the dimensions creates a gap 68 to allow the spacer portion to float somewhat between the metal plate portions. The gap is shown at the bottom of the spacer portion in FIG. 9 and at the top of the spacer portion in FIG. 10. The size of the gap can be determined in consideration of the possible magnitude with which a particular spacer portion of a particular dielectric housing 20 might bow. In an actual embodiment, the gap has been set at 0.13 mm. With this gap allowing some floating movement between the spacer portion and the upper and lower plate portions, bowing of the spacer portion will not affect the connections between the conductive metal connecting member 50 and grounding pads 44 and 48 on upper and lower circuit boards 16 and 18, respectively.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A connection device for connecting a pair of circuit boards, comprising:

a dielectric housing having a spacer portion for positioning between an upper circuit board and a lower circuit board;

a conductive metal connecting member including an upper plate portion sandwiched between said upper circuit board and an upper surface of the spacer portion, a lower plate portion sandwiched between said lower circuit board and a lower surface of the spacer portion, and a connecting portion connecting the upper and lower plate portions;

a fastener extending through the circuit boards and the spacer portion;

said upper plate portion being engageable with a conductive pad on the upper circuit board and including a hole through which the fastener extends; and said lower plate portion being engageable with a conductive pad on the lower circuit board and being disposed to one side away from the fastener.

2. The connection device of claim 1 wherein said fastener comprises a bolt.

3. The connection device of claim 1 wherein said housing, including said spacer portion, includes a bottom face for mounting on the lower circuit board, and the spacer portion includes a recessed area for receiving said lower plate portion.

4. The connection device of claim 1, including complementary interengaging latch means between the connecting member and the housing.

5. The connection device of claim 4 wherein said latch means comprise a latch hole in one of the upper and lower plate portions for receiving a latch boss on the spacer portion of the housing.

6. The connection device of claim 5 wherein both of the upper and lower plate portions have latch holes for receiving latch bosses on the top and bottom of the spacer portion.

7. The connection device of claim 1 wherein said conductive metal connecting member is generally C-shaped.

8. The connection device of claim 1 wherein the upper and lower plate portions of the conductive metal connecting member are separated by a distance which is greater than a thickness of the spacer portion of the dielectric housing whereby a gap dimension is defined as an amount the distance between the upper and lower plate portions is greater than the thickness of the spacer portion.

9. A connection device for connecting a pair of circuit boards, comprising:

a dielectric housing having a spacer portion for positioning between an upper circuit board and a lower circuit board;

a generally C-shaped conductive metal connecting member including an upper plate portion sandwiched between said upper circuit board and an upper surface of the spacer portion, a lower plate portion sandwiched between said lower circuit hoard and a lower surface of the spacer portion, and a connecting portion connecting the upper and lower plate portions;

an elongated bolt extending through the circuit boards and the spacer portion;

said upper plate portion being engageable with a conductive pad on the upper circuit board and including a hole through which the fastener extends;

said lower plate portion being engageable with a conductive pad on the lower circuit board and being disposed to one side away from the fastener; and complementary interengaging latch means between the connecting member and the housing.

10. The connection device of claim 9 wherein said housing, including said spacer portion, includes a bottom face for mounting on the lower circuit board, and the spacer portion includes a recessed area for receiving said lower plate portion.

11. The connection device of claim 9 wherein said latch means comprise a latch hole in one of the upper and lower plate portions for receiving a latch boss on the spacer portion of the housing.

12. The connection device of claim 11 wherein both of the upper and lower plate portions have latch holes for receiving latch bosses on the top and bottom of the spacer portion.

13. The connection device of claim 9 wherein the upper and lower plate portions of the conductive metal connecting member are separated by a distance which is greater than a thickness of the spacer portion of the dielectric housing whereby a gap dimension is defined as an amount the distance between the upper and lower plate portions is greater than the thickness of the spacer portion.

14. The connection device of claim 8 wherein the spacer portion includes a bottom face for mounting on the lower circuit board and with the spacer portion including a recessed area for receiving said lower plate portion whereby the lower plate portion can move within the recessed area an amount not greater than the gap dimension.

15. The connection device of claim 13 wherein the spacer portion includes a bottom face for mounting on the lower circuit board and with the spacer portion including a recessed area for receiving said lower plate portion whereby the lower plate portion can move within the recessed area an amount not greater than the gap dimension.

* * * * *